US012563899B2

(12) United States Patent
Kim et al.

(10) Patent No.: US 12,563,899 B2
(45) Date of Patent: Feb. 24, 2026

(54) DISPLAY PANEL AND DISPLAY APPARATUS INCLUDING THE SAME

(71) Applicant: LG Display Co., Ltd., Seoul (KR)

(72) Inventors: Taehwi Kim, Paju-si (KR); Jungchul Kim, Paju-si (KR); Sohyun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 736 days.

(21) Appl. No.: 17/975,973

(22) Filed: Oct. 28, 2022

(65) Prior Publication Data

US 2023/0209897 A1 Jun. 29, 2023

(30) Foreign Application Priority Data

Dec. 29, 2021 (KR) .......................... 10-2021-0190655

(51) Int. Cl.
*H10K 59/121* (2023.01)
*H10D 30/67* (2025.01)
*H10D 86/40* (2025.01)
*H10D 86/60* (2025.01)

(52) U.S. Cl.
CPC ..... *H10K 59/1213* (2023.02); *H10D 30/6745* (2025.01); *H10D 30/6755* (2025.01); *H10D 86/423* (2025.01); *H10D 86/60* (2025.01)

(58) Field of Classification Search
CPC ............. H10K 59/1213; H10K 59/121; H10K 59/123; H10K 59/124; H10D 30/6745; H10D 30/6755; H10D 86/423; H10D 86/60; H10D 86/0212; H10D 86/451; H10D 86/411
USPC .......................................................... 257/40
See application file for complete search history.

(56) References Cited

U.S. PATENT DOCUMENTS

2018/0366586 A1* 12/2018 Son ........................ H10D 86/60

* cited by examiner

*Primary Examiner* — Monica D Harrison
(74) *Attorney, Agent, or Firm* — Seed Intellectual Property Law Group LLP

(57) ABSTRACT

Disclosed is a display panel including: a substrate divided into a first area and a second area positioned outside the first area; a buffer layer disposed in the first area and the second area and disposed on the substrate; a first thin-film transistor including a polycrystalline semiconductor layer disposed in the first area and disposed on the buffer layer, and a first gate electrode disposed on the polycrystalline semiconductor layer; a second thin-film transistor including an oxide semiconductor layer disposed in the first area and disposed on the buffer layer, and a second gate electrode disposed on the oxide semiconductor layer; a first intermediate insulating layer disposed between the first area and the second area and interposed between the first thin-film transistor and the second thin-film transistor; a first contact hole passing through the first intermediate insulating layer on the polycrystalline semiconductor layer; and a second contact hole passing through the first intermediate insulating layer in the second area.

17 Claims, 8 Drawing Sheets

AA

DISPLAY PANEL AND DISPLAY APPARATUS INCLUDING THE SAME

CROSS-REFERENCE TO RELATED APPLICATIONS

The present application claims priority to Republic of Korea Patent Application No. 10-2021-0190655, filed on Dec. 29, 2021, the entire contents of which is incorporated herein for all purposes by this reference.

BACKGROUND

Technical Field

The present disclosure relates to a thin-film transistor substrate and a display apparatus using the same.

Description of the Related Art

With the development of the information society, the demand for display apparatus for displaying images is also increasing in various forms. The display apparatus field has rapidly changed to a thin, light, and large-area flat panel display apparatus (FPD) replacing a bulky cathode ray tube (CRT). The flat panel display apparatus includes a liquid crystal display apparatus (LCD), a plasma display panel (PDP), an organic light-emitting display apparatus (OLED), an electrophoretic display apparatus (ED), etc.

An active liquid crystal display apparatus, an organic light emitting display apparatus, and an electrophoretic display apparatus include a thin-film transistor substrate in which thin-film transistors are assigned within pixel areas arranged in a matrix form. The liquid crystal display apparatus (LCD) displays images by adjusting the light transmittance of the liquid crystal by using an electric field. The organic light emitting display apparatus displays images by forming an organic light emitting apparatus in the pixel itself arranged in a matrix form.

The organic light emitting diode display apparatus is a self-luminous element that emits light by itself, has a rapid response speed, and has great advantages in light emission efficiency, luminance, and viewing angle. In particular, the organic light emitting diode display (OLED) apparatus using the characteristics of an organic light emitting diode with excellent energy efficiency is classified broadly into a passive matrix type organic light emitting diode display (PMOLED) and an active-matrix type organic light emitting diode display (AMOLED).

As personal electronic apparatus is actively developed, the display apparatus is also being developed as products with excellent portability and/or wearability. As such, in order to apply the display apparatus to a portable or wearable apparatus, a display apparatus with low power consumption is beneficial. There is a limitation in implementing low power consumption by technologies related to display apparatuses developed so far.

BRIEF SUMMARY

In order to overcome the problems of the prior art, the purpose of the present disclosure is to provide a thin-film transistor substrate including two or more types of thin-film transistors on the same substrate and to provide a display apparatus using the same.

The purpose of the present disclosure is to improve uniformity of characteristics of a second thin-film transistor apparatus, regardless of where pixels are arranged.

As a means for accomplishing the above-described purpose, the present disclosure has embodiments having the following features.

One embodiment is a display panel including: a substrate divided into a first area and a second area positioned outside the first area; a buffer layer disposed in the first area and the second area and disposed on the substrate; a first thin-film transistor including a polycrystalline semiconductor layer disposed in the first area and disposed on the buffer layer, and a first gate electrode disposed on the polycrystalline semiconductor layer; a second thin-film transistor including an oxide semiconductor layer disposed in the first area and disposed on the buffer layer, and a second gate electrode disposed on the oxide semiconductor layer; a first intermediate insulating layer disposed between the first area and the second area and interposed between the first thin-film transistor and the second thin-film transistor; a first contact hole passing through the first intermediate insulating layer on the polycrystalline semiconductor layer; and a second contact hole passing through the first intermediate insulating layer in the second area.

The first thin-film transistor further includes a first gate insulating layer interposed between the polycrystalline semiconductor layer and the first gate electrode.

The first contact hole and the second contact hole pass through the first gate insulating layer.

The display panel further includes a passivation layer disposed in the first area and the second area and disposed on the second thin-film transistor. The passivation layer is connected to the buffer layer through the second contact hole.

The second thin-film transistor further includes a second gate insulating layer interposed between the oxide semiconductor layer and the second gate electrode.

The first contact hole and the second contact hole pass through the second gate insulating layer.

The display panel further includes a passivation layer disposed in the first area and the second area and disposed on the second thin-film transistor. The passivation layer fills the second contact hole.

The polycrystalline semiconductor layer is also disposed in the second area.

The display panel further includes a passivation layer disposed in the first area and the second area and disposed on the second thin-film transistor. The passivation layer is connected, through the second contact hole, to the polycrystalline semiconductor layer disposed in the second area.

The first thin-film transistor further includes a first gate insulating layer interposed between the polycrystalline semiconductor layer and the first intermediate insulating layer.

The first contact hole and the second contact hole pass through the first gate insulating layer.

The first area is a display area where a plurality of pixels is arranged, and the second area is a non-display area.

The plurality of pixels includes a plurality of edge pixels disposed at a boundary between the first area and the second area. The second contact hole is disposed to surround the plurality of edge pixels.

Each of the pixels has a first length in a first direction and a second length in a second direction perpendicular to the first direction. The first length is shorter than the second length. The second contact hole is arranged in the second area within a distance shorter than the first length from a boundary between the first area and the second area.

The display panel according to the embodiment of the present disclosure includes two or more types of thin-film transistors on the same substrate. Also, the second thin-film transistor apparatus can have uniform characteristics, regardless of where pixels are arranged.

DETAILED DESCRIPTION

Figure 1:
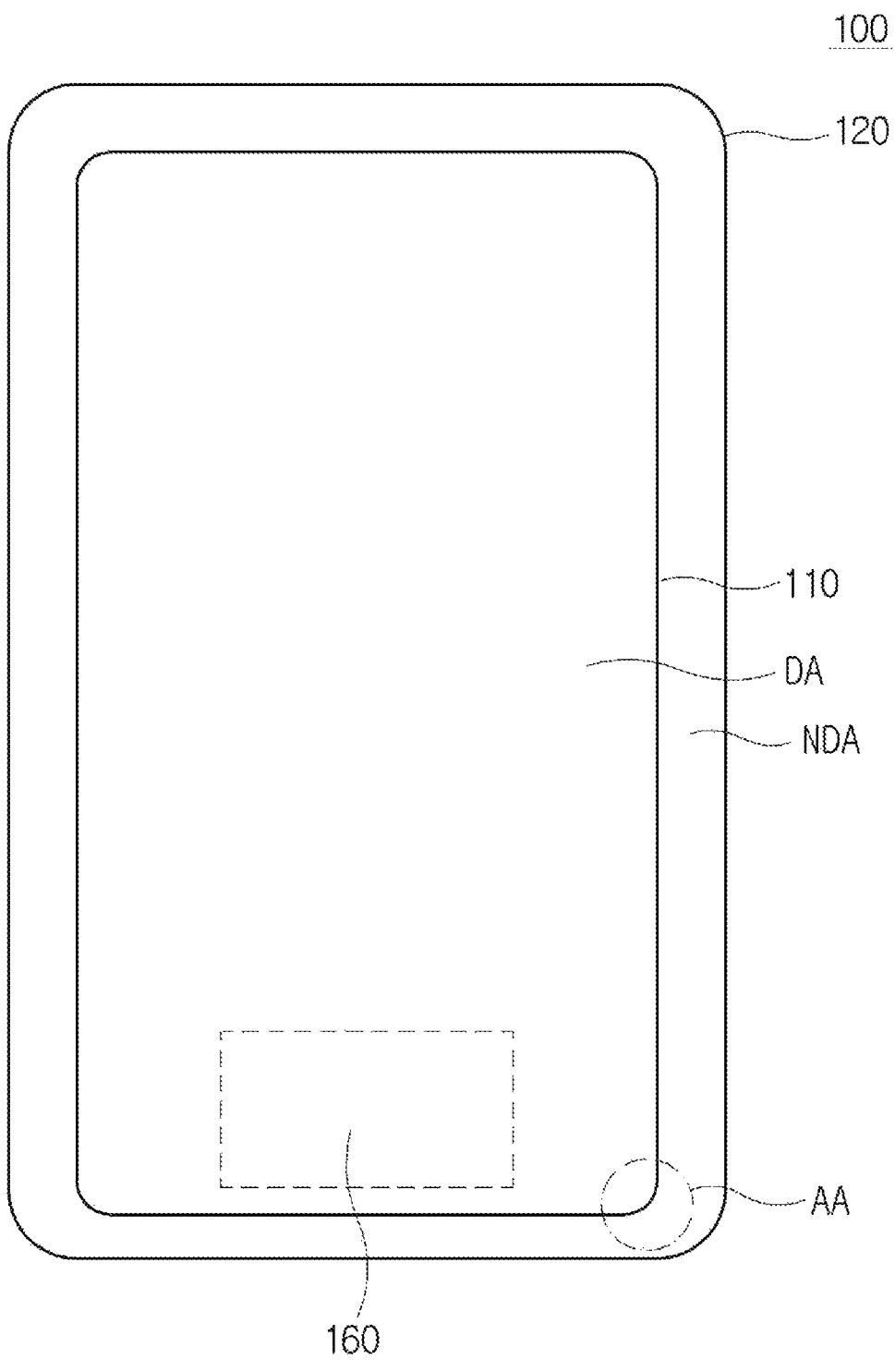
FIG. 1 is a plan view of a display apparatus according to an embodiment of the present disclosure.

Since the shapes, sizes, proportions, angles, numbers, etc., disclosed in the drawings for describing the embodiments of the present disclosure are illustrative, the present disclosure is not limited to the shown details. The same reference numerals throughout the disclosure correspond to the same elements. Also, throughout the description of the present disclosure, the detailed description of known technologies incorporated herein will be omitted when it may make the subject matter of the present disclosure unclear. Terms such as "includes," "has," "composed," etc., mentioned in the present disclosure are used, other parts can be added unless a term "only" is used. A component represented in a singular form includes the expression of plural form thereof unless otherwise explicitly mentioned.

In construing components, error ranges are construed as being included even unless otherwise explicitly mentioned.

In describing positional relationships, when the positional relationship of two parts is described, for example, "on," "over," "under," "next to," etc., one or more other parts may be positioned between the two parts as long as a term "directly" or "immediately" is not used.

While terms such as the first and the second, etc., can be used to describe various components, the components are not limited by the terms mentioned above. The terms are used only for distinguishing between one component and other components. Therefore, the first component to be described below may be the second component within the spirit of the present disclosure.

The same reference numerals throughout the disclosure correspond to the same elements.

Hereinafter, various embodiments of the present disclosure will be described in detail with reference to the accompanying drawings. The component names used in the following description are selected in consideration of making it easier to write the specification and may be different from the component names of an actual product.

FIG. 1 is a plan view of a display apparatus according to an embodiment of the present disclosure.

The display apparatus 100 may include a display panel 110, a cover glass 120, and a driving circuit 160.

The display panel 110 may be divided into a display area DA and a non-display area NDA that is a bezel area surrounding the edge of the display area DA.

The non-display area NDA may include a pad portion adjacent to and outside the display area DA. A plurality of sub-pixels may be disposed in the display area DA. The sub-pixels may be arranged in red (R), green (G), blue (B) way or in an R, G, B, and white (W) way within the display area DA to create full color. The sub-pixels may be partitioned by a gate line and a data line which crossing each other.

The cover glass 120 is provided to cover the front side of the display panel 110 and serves to protect the display panel 110.

The driving circuit 160 may be disposed on the rear side of the display panel 110. The driving circuit 160 may include bumps (or terminals). The bumps of the driving circuit 160 may be bonded to the pads of the pad portion respectively through an anisotropic conductive film. The driving circuit 160 may be a chip on film (COF) in which a driving IC is mounted on a flexible film.

In addition, the driving circuit 160 may be implemented in a chip on glass (COG) type in which a driving IC is directly bonded to pads on a substrate through a COG process. Also, the driving circuit 160 may be a flexible circuit such as a flexible flat cable (FFC) or a flexible printed circuit (FPC).

In the display apparatus 100, sufficient space for the pad portion or the like to be positioned is present in addition to the display area DA in which an input image is formed. Such a space corresponds to a bezel area, and the bezel area may be recognized by a user positioned in front of the display apparatus 100. This may be a factor degrading aesthetics.

Figure 2:
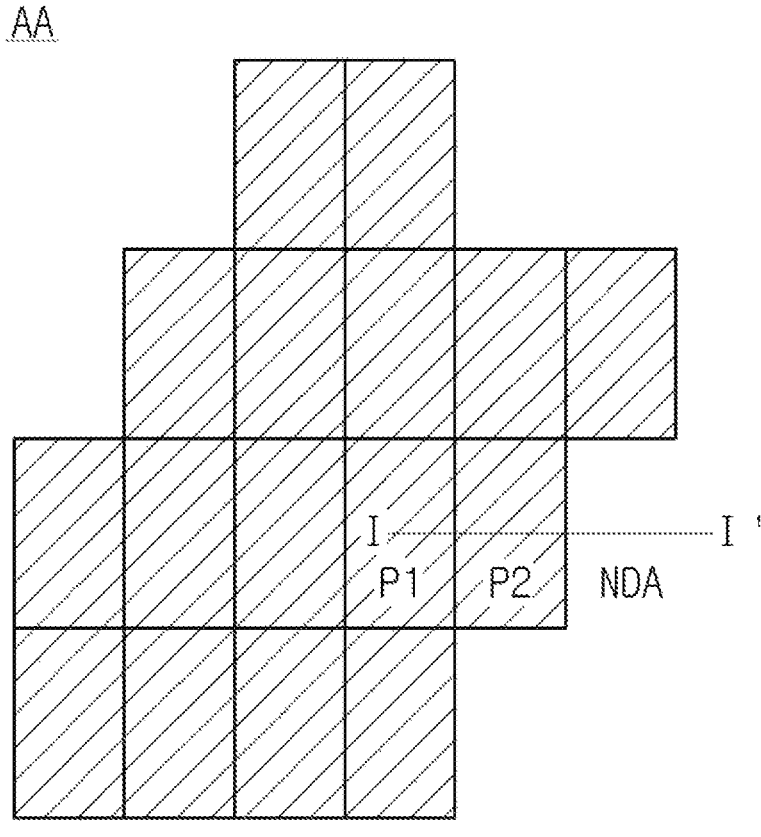
FIG. 2 is an enlarged view of a part "AA" of FIG. 1.

FIG. 2 is an enlarged view of a part "AA" of FIG. 1.

Referring to FIGS. 1 and 2, the part "AA" is an edge portion at the bottom right of the display panel 110 and corresponds to a boundary between the display area DA and the non-display area NDA.

A first pixel P1 and a second pixel P2 are arranged in the display area DA.

Pixels are arranged in both left and right areas of the first pixel P1. That is, adjacent pixels are arranged on left and right sides of the first pixel P1.

The second pixel P2 (i.e., an edge pixel) is positioned at the boundary between the display area DA and the non-display area NDA. While the pixel is arranged in the left area of the second pixel P2, no pixel is arranged in the right area of the second pixel P2. That is, while adjacent pixels are arranged on the left side of the second pixel P2, adjacent pixels are not arranged on the right side of the second pixel P2.

Comparative Example

Figure 3:
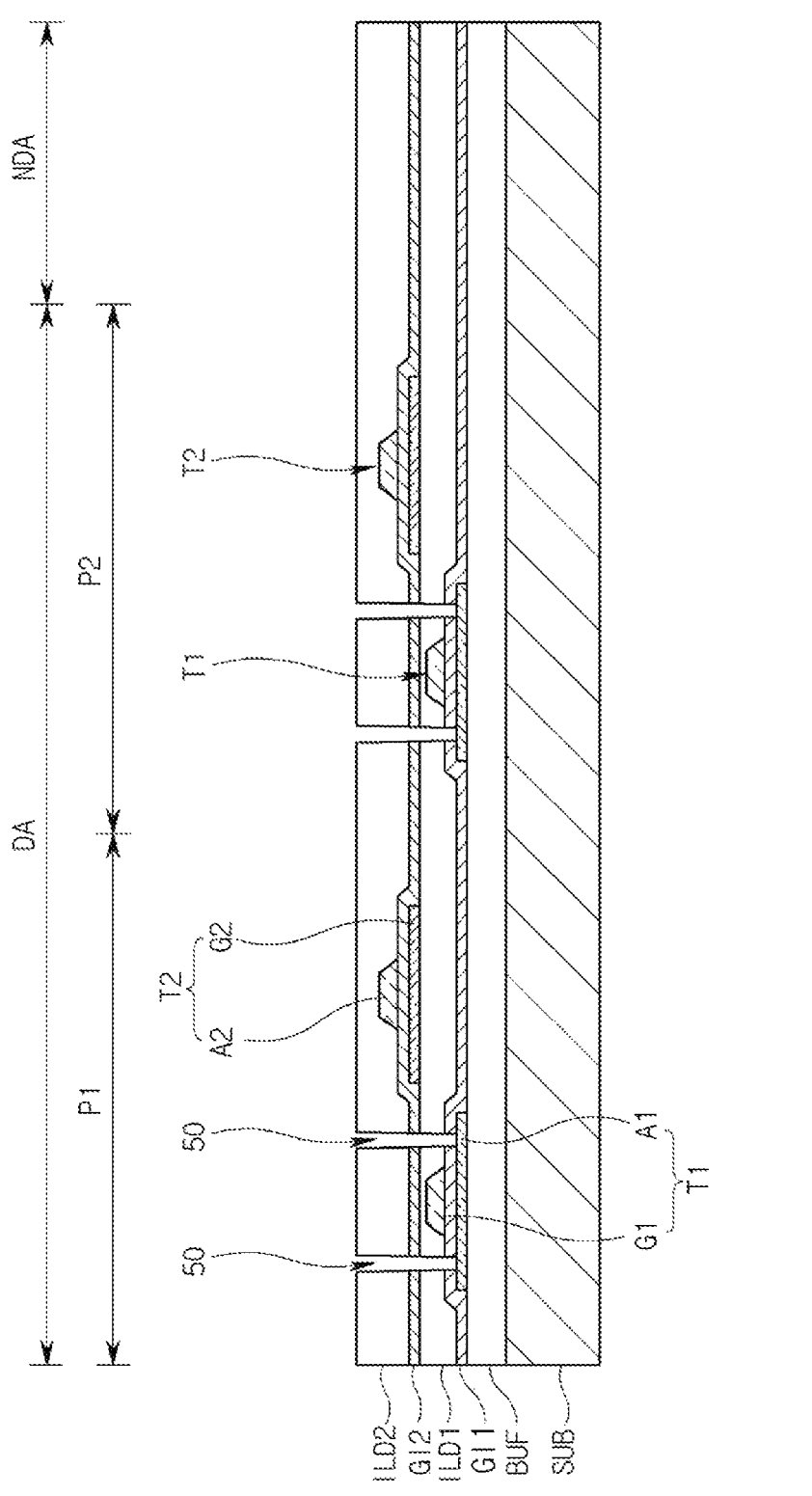
FIG. 3 is a cross-sectional view taken along cut line I-I' of FIG. 2.

FIG. 3 is a cross-sectional view taken along line I-I' of FIG. 2.

The display panel 110 according to the embodiment of the present disclosure is characterized in that two types of thin-film transistors are disposed on one substrate.

The display panel according to the embodiment includes a first thin-film transistor T1 and a second thin-film transistor T2 disposed on a substrate SUB. The first and second thin-film transistors T1 and T2 may be disposed to be spaced apart from each other or disposed adjacent to each other. Alternatively, the two thin-film transistors may be disposed to be overlapped.

The substrate SUB is divided into a first area and a second area positioned outside the first area. The first area may be the display area DA in which a plurality of pixels is arranged, and the second area may be the non-display area NDA.

A buffer layer BUF is stacked on the entire surface of the substrate SUB. In some cases, the buffer layer BUF may be omitted. Alternatively, the buffer layer BUF may have a structure in which a plurality of thin-film layers is stacked. Here, for convenience, the buffer layer BUF is described as having a single layer structure. In addition, a light-blocking layer may be selectively further provided only in advantageous portions between the buffer layer BUF and the substrate SUB. The light-blocking layer may be formed for the purpose of preventing external light from entering into a semiconductor layer of the thin-film transistor disposed on the light-blocking layer.

A first semiconductor layer A1 is disposed on the buffer layer BUF. The first semiconductor layer A1 includes a channel region of the first thin-film transistor T1. The channel region is a region where a first gate electrode G1 and the first semiconductor layer A1 overlap. Since the first gate electrode G1 overlaps the central portion of the first thin-film transistor T1, the central portion of the first thin-film transistor T1 becomes the channel region. Both sides of the channel region are doped with impurities, and may be referred to as a source region and a drain region.

When the first thin-film transistor T1 is a thin-film transistor for a driving element, it is preferable that the first thin-film transistor T1 can have characteristics suitable for performing high-speed driving processing. For example, a P-MOS or N-MOS type thin-film transistor may be used, or a C-MOS type thin-film transistor including both may be provided. In one embodiment, the P-MOS, N-MOS and/or C-MOS type thin-film transistors can include a polycrystalline semiconductor material such as poly-silicon. In addition, in one embodiment, the first thin-film transistor T1 can have a top-gate structure.

A gate insulating layer GI is stacked on the entire surface of the substrate SUB on which the first semiconductor layer A1 has been disposed. The gate insulating layer GI may be made of silicon nitride (SiNx) or silicon oxide (SiOx). When the gate insulating layer GI is made of silicon nitride (SiNx), a large amount of hydrogen may be included within the gate insulating layer GI due to the manufacturing process. Since these hydrogens may diffuse out of the gate insulating layer GI in a subsequent process, it is preferable that the gate insulating layer GI can be made of a silicon oxide material.

In the first semiconductor layer A1 including a polycrystalline silicon material, hydrogen diffusion may produce a positive effect. However, hydrogen diffusion may produce a negative effect on the second thin-film transistor T2 having different properties from those of the first thin-film transistor T1. Accordingly, when thin-film transistors using different materials are formed on the same substrate as in the present disclosure, it is more preferable to use silicon oxide (SiOx) which does not particularly affect the apparatus in the present disclosure. In this case, when the gate insulating layer GI is made of silicon nitride (SiNx), the degree of hydrogen diffusion may increase. Accordingly, in consideration of various cases, it is recommended that a first gate insulating layer GI1 is made of silicon oxide (SiOx).

The first gate electrode G1 is disposed on the first gate insulating layer GI1. The first gate electrode G1 is disposed to overlap the central portion of the first semiconductor layer A1.

A first intermediate insulating layer ILD1 is disposed on the first gate electrode G1. The first intermediate insulating layer ILD1 is stacked to cover the first gate electrode G1. It is preferable that the first intermediate insulating layer ILD1 can have a multilayer structure in which a nitride layer SIN including silicon nitride (SiNx) and an oxide layer SIO including silicon oxide (SiOx) are alternately stacked. Here, a double-layer structure, as a minimum component for convenience, in which the oxide layer SIO is stacked on the nitride layer SIN will be described.

The nitride layer SIN is for diffusing hydrogen contained therein through a subsequent heat-treatment process and performing a hydrogenation treatment on the first semiconductor layer which includes polysilicon. On the other hand, the oxide layer SIO is for preventing hydrogen diffused from the nitride layer SIN by the subsequent heat-treatment process from diffusing too much into the semiconductor material of the second thin-film transistor T2.

For example, it is desirable that the hydrogen diffused from the nitride layer SIN can be diffused into the first semiconductor layer A1 disposed below the nitride layer with the first gate insulating layer GI1 placed between the first semiconductor layer A1 and the first intermediate insulating layer ILD1. Accordingly, it is preferable that the nitride layer SIN is stacked on the first gate insulating layer GI1 in such a manner as to be close to the first semiconductor layer A1.

A second semiconductor layer A2 overlapping a second gate electrode G2 is disposed on the first intermediate insulating layer ILD1. The second semiconductor layer A2 includes a channel region of the second thin-film transistor T2. When the second thin-film transistor T2 is a thin-film transistor for a display element, it is preferable that the second thin-film transistor T2 can have properties suitable for performing display function processing. For example, it is recommended that the second thin-film transistor T2 includes an oxide semiconductor material such as Indium Gallium Zinc Oxide (IGZO), Indium Gallium Oxide (IGO), and Indium Zinc Oxide (IZO). The oxide semiconductor material has a low off-current characteristic, and thus a voltage duration period of a pixel becomes longer, so the oxide semiconductor material is suitable for a display apparatus requiring low-speed driving and low power consumption.

The second gate electrode G2 is disposed on the second semiconductor layer A2. The second gate electrode G2 constituting the second thin-film transistor T2 may be made of the same material as that of the first gate electrode G1 constituting the first thin-film transistor T1. The second gate electrode G2 is disposed on a portion of the second thin-film transistor T2.

A second intermediate insulating layer ILD2 is disposed on the second gate electrode G2. The second intermediate insulating layer ILD2 is stacked to cover the second gate electrode G2. Unlike the first intermediate insulating layer ILD1, the second intermediate insulating layer ILD2 may be formed as a single layer of the oxide layer SIO including silicon oxide (SiOx).

A contact hole 50 which exposes one side and the other side of the first semiconductor layer A1, respectively is formed on the second intermediate insulating layer ILD2. The contact hole 50 passes through the second intermediate insulating layer ILD2, a second gate insulating layer GI2, the first intermediate insulating layer ILD1, and the first gate insulating layer GI1 and exposes one side and the other side of the first semiconductor layer A1, respectively.

As described above, the display panel according to the embodiment of the present disclosure is characterized in that two types of thin-film transistors are disposed on one substrate.

The inventors of the present disclosure have found that a deviation occurred in the apparatus characteristics of the second thin-film transistor T2 in accordance with positions where the pixels are arranged in the structure of FIG. 3.

As described above, in the first semiconductor layer A1 including the polycrystalline silicon material, hydrogen diffusion may produce a positive effect. However, hydrogen diffusion may produce a negative effect on the second thin-film transistor T2 having different properties from those of the first thin-film transistor T1.

During the hydrogenation process, since a large amount of hydrogen is included in the material used in the manufacture of the nitride layer SIN constituting the first intermediate insulating layer ILD1, a significant amount of hydrogen is also included in the stacked nitride layer itself. Through the heat-treatment process, hydrogen diffuses into the polycrystalline semiconductor material.

Hydrogen generated from the nitride layer SIN escapes through the contact hole 50 in the subsequent process. The density of the contact hole 50 disposed adjacent to the second thin-film transistor T2 disposed in the first pixel P1 is different from the density of the contact hole 50 disposed adjacent to the second thin-film transistor T2 disposed in the second pixel P2.

In detail, the contact hole 50 formed in the first thin-film transistor T1 disposed in the first pixel P1 is disposed on the left side of the second thin-film transistor T2 disposed in the first pixel P1. Also, the contact hole 50 formed in the first thin-film transistor T1 disposed in the second pixel P2 is disposed on the right side of the second thin-film transistor T2 disposed in the first pixel P1. That is, the contact hole 50 is disposed on the left and right sides of the second thin-film transistor T2 disposed in the first pixel P1, respectively.

On the other hand, the contact hole 50 formed in the first thin-film transistor T1 disposed in the second pixel P2 is only disposed on the left side of the second thin-film transistor T2 disposed in the second pixel P2, and the right side of the second thin-film transistor T2 disposed in the second pixel P2 is adjacent to the non-display area NDA. That is, the contact hole 50 is only disposed on the left side of the second thin-film transistor T2 disposed in the second pixel P2, and no contact hole 50 is disposed on the right side because the right side is adjacent to the non-display area NDA.

Hydrogen generated from the nitride layer SIN escapes through the contact hole 50 in the subsequent process. There is a difference between the density of the contact hole 50 surrounding the second thin-film transistor T2 disposed in the first pixel P1 and the density of the contact hole 50 surrounding the second thin-film transistor T2 disposed in the second pixel P2. Namely, number and physical volume of contact holes 50 adjacent the second thin-film transistor T2 is smaller than those adjacent the first thin-film transistor T2, due to the second thin-film transistor T2 being adjacent the non-display area NDA, which is free of contact holes 50. As a result, there occurs a difference in concentrations of hydrogen which affects the second semiconductor layer A2 of the second thin-film transistor T2 disposed in the first pixel P1 and the second thin-film transistor T2 disposed in the second pixel P2. Consequently, such a difference in hydrogen concentration causes a deviation in the apparatus characteristics of the second thin-film transistor T2 in accordance with positions where the pixels are arranged in the structure of FIG. 3. It should be understood that "surrounding" includes the meaning of "adjacent to" or "nearby," and does not require that the contact holes 50 completely surround the second thin-film transistor T2. For example, the second thin-film transistor T2 of the first pixel P1 can be said to have two or four contact holes 50 adjacent thereto, or in the immediate vicinity thereof, and the second thin-film transistor T2 of the second pixel P2 has one or two contact holes 50 adjacent thereto, or in the immediate vicinity thereof.

Embodiment

FIGS. 4 to 7 are cross-sectional views taken along line I-I' of FIG. 2 according to the embodiment of the present disclosure.

As described above, in the display panel 110 according to the comparative example, there has been described the problem that, due to the difference between the density of the contact hole 50 surrounding the second thin-film transistor T2 disposed in the first pixel P1 and the density of the contact hole 50 surrounding the second thin-film transistor T2 disposed in the second pixel P2, a deviation is caused in the apparatus characteristics of the second thin-film transistor T2 in accordance with positions where the pixels are arranged.

In the embodiment to be described below, the difference between the density of the contact hole surrounding the second thin-film transistor T2 disposed in the first pixel P1 and the density of the contact hole surrounding the second thin-film transistor T2 disposed in the second pixel P2 is removed by arranging additional contact holes in the second area. As a result, it is possible to solve the problem that a deviation is caused in the apparatus characteristics of the second thin-film transistor T2 in accordance with positions where the pixels are arranged.

Figure 4:
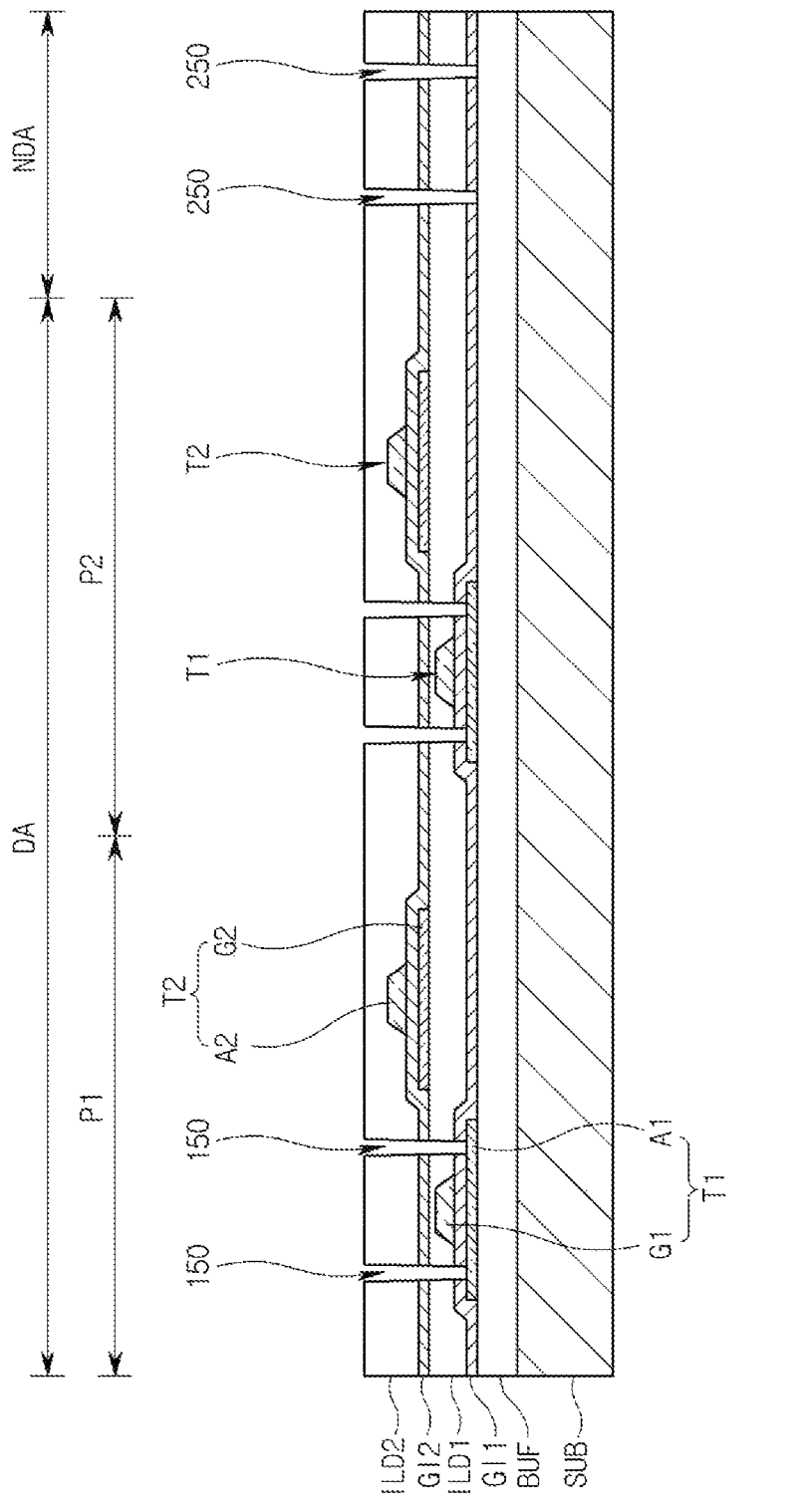
FIGS. 4 to 7 are cross-sectional views taken along line I-I' of FIG. 2 according to the embodiment of the present disclosure.

First, the embodiment of FIG. 4 is different from that of FIG. 3 in that a second contact hole is disposed in the second area.

A first contact hole 150 disposed in the first thin-film transistor T1 is formed to expose one side and the other side of the first semiconductor layer A1, respectively. The first contact hole 150 passes through the second intermediate insulating layer ILD2, the second gate insulating layer GI2, the first intermediate insulating layer ILD1, and the first gate insulating layer GI1, and then exposes one side and the other side of the first semiconductor layer A1, respectively.

The second contact hole 250 is disposed in the second area. The second contact hole 250 passes through the second intermediate insulating layer ILD2, the second gate insulating layer GI2, the first intermediate insulating layer ILD1, and the first gate insulating layer GI1.

In the embodiment of FIG. 4, a contact hole passing through the first intermediate insulating layer ILD1 is also formed in the second area. Therefore, unlike the comparative example of FIG. 3, the density deviation of the contact hole surrounding the second thin-film transistors T2 of the second pixel P2 arranged in the boundary and of the first pixel P1 arranged in the display area DA is eliminated. Accordingly, the deviation in the apparatus characteristics of the second thin-film transistors of the second pixel P2 arranged in the boundary and of the first pixel P1 arranged in the display area DA can be eliminated.

Figure 5:
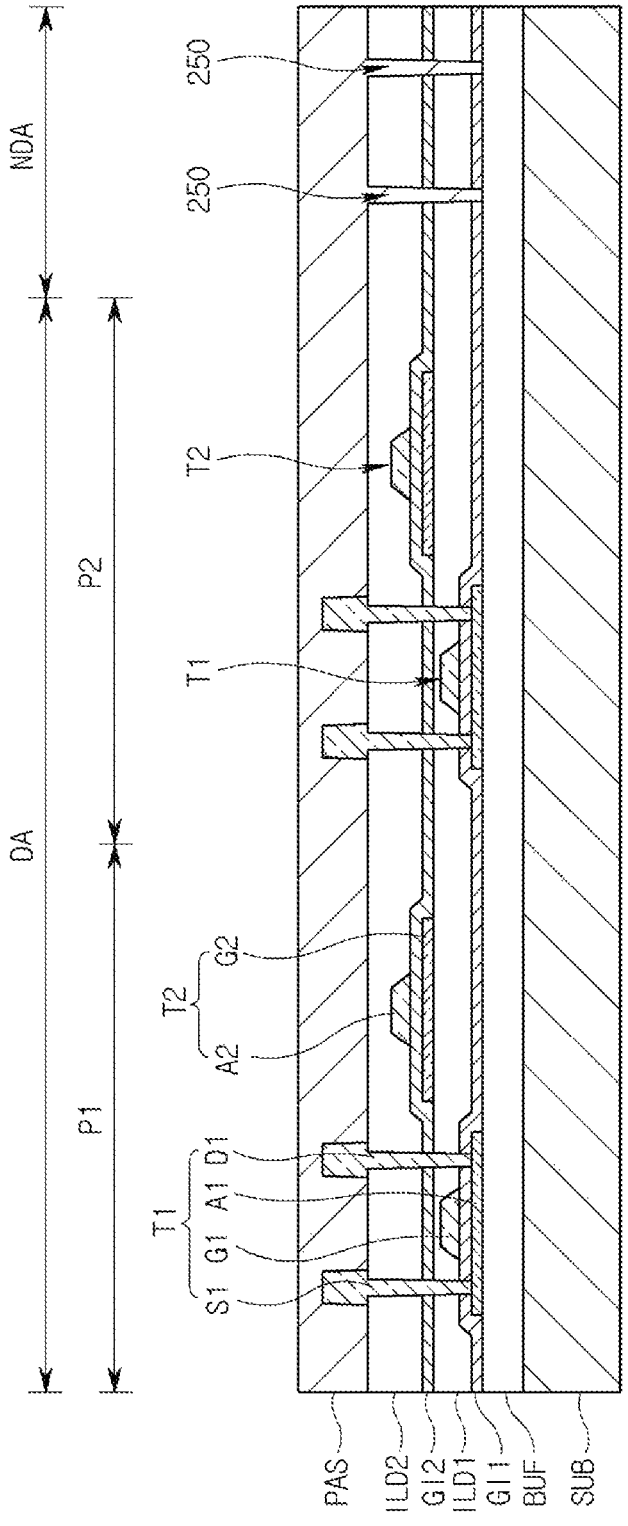

FIG. 5 is a cross-sectional view of the display panel on which passivation layer deposition has been completed in FIG. 4.

Referring to FIGS. 4 and 5, a source electrode S1 and a drain electrode D1 are formed in the first contact hole 150.

The source electrode S1 and the drain electrode D1 are connected to the first semiconductor layer A1 through the first contact hole 150.

A passivation layer PAS is disposed on the second intermediate insulating layer ILD2 and is disposed to cover the source electrode S1 and the drain electrode D1. The passivation layer PAS may fill the second contact hole 250. The passivation layer PAS may be connected to the buffer layer through the second contact hole 250 in the second area NDA.

Figure 6:
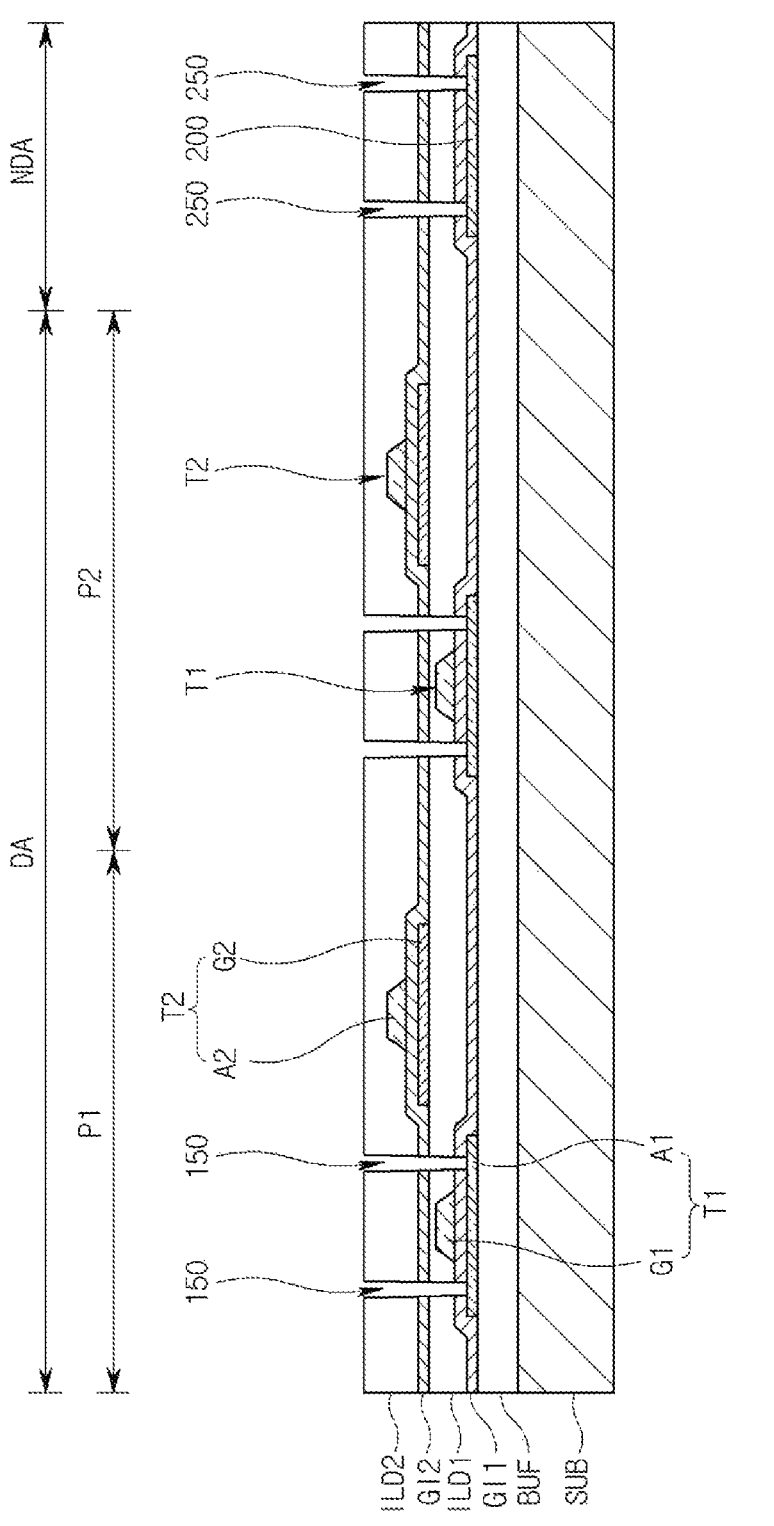

FIG. 6 shows an embodiment different from that of FIG. 4. The embodiment of FIG. 6 is different from that of FIG. 4 in that a hole stopper layer 200 is disposed in the second area NDA. The hole stopper layer 200 may be made of the same material as that of the first semiconductor layer A1 in the same process.

The second contact hole 250 is placed in the second area NDA. The second contact hole 250 passes through the second intermediate insulating layer ILD2, the second gate insulating layer GI2, the first intermediate insulating layer ILD1, and the first gate insulating layer GI1.

The hole stopper layer 200 may function as a stopper in order for the second contact hole 250 not to damage the buffer layer BUF. The buffer layer BUF serves to protect the first thin-film transistor T1 and the second thin-film transistor from the outside. When the second contact hole 250 passes through even the buffer layer BUF, the first thin-film transistor T1 and the second thin-film transistor T2 may be damaged from the outside.

Figure 7:
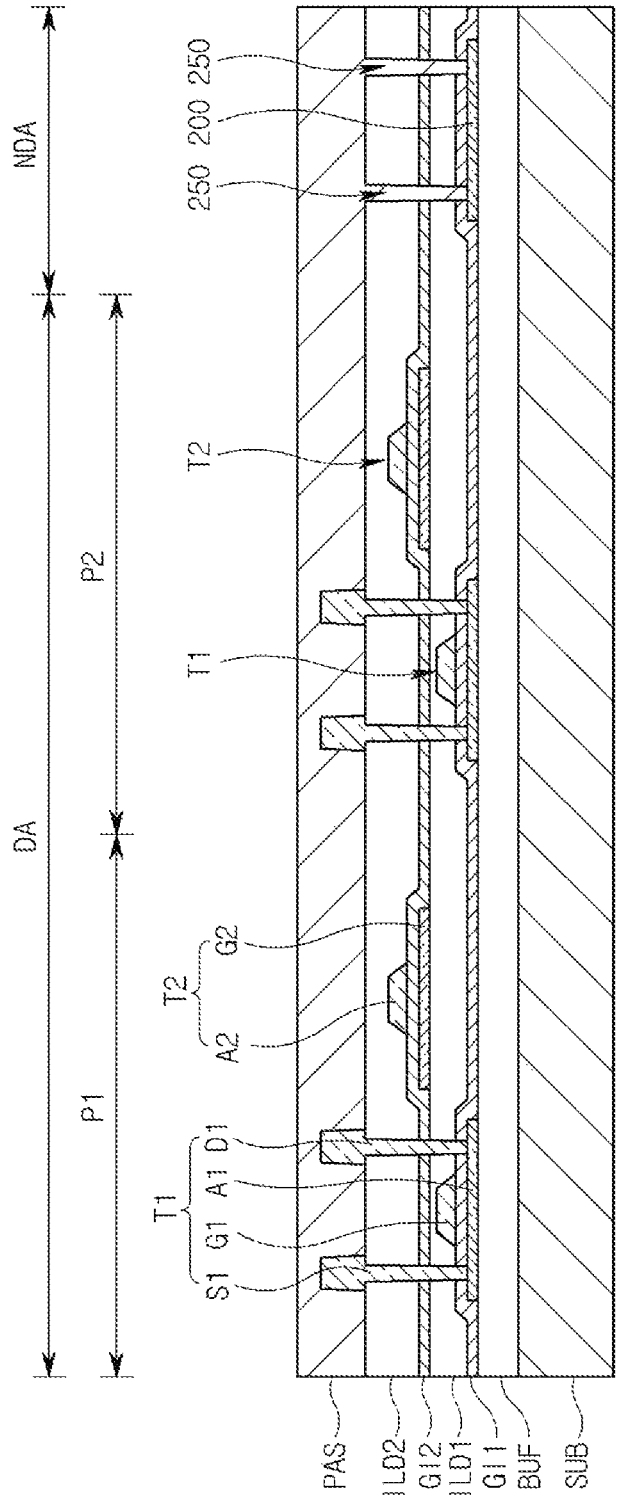

FIG. 7 is a cross-sectional view of the display panel on which the passivation layer PAS deposition has been completed in FIG. 6.

Referring to FIGS. 6 and 7, the source electrode S1 and the drain electrode D1 are formed in the first contact hole 150.

The source electrode S1 and the drain electrode D1 are connected to the first semiconductor layer A1 through the first contact hole 150.

Figure 8:
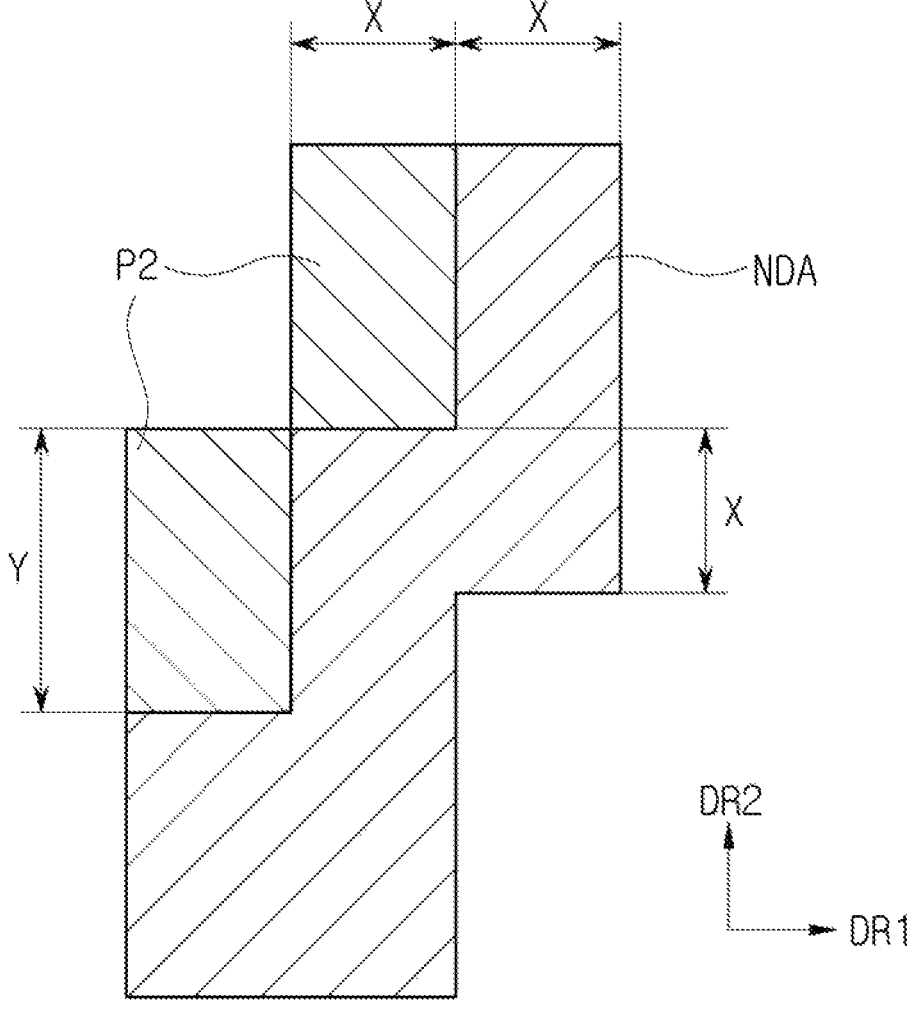
FIG. 8 is a view for describing the arrangement of a second contact hole according to the embodiment of the present disclosure.

The passivation layer PAS is disposed on the second intermediate insulating layer ILD2 and is disposed to cover the source electrode S1 and the drain electrode D1. The passivation layer PAS may fill the second contact hole 250. The passivation layer PAS may be connected to the hole stopper layer 200 through the second contact hole 250 in the second area NDA. It should be understood that "fill" includes within its meaning to "partially fill" and "completely fill" unless expressly stated differently herein for a particular structure. For example, the passivation layer PAS may completely fill the second contact hole 250 such that the passivation layer PAS is in contact with sidewalls of the layers through which the second contact hole 250 extends. In another example, the passivation layer PAS may partially fill the remaining area of the second contact hole 250, such that the passivation layer PAS is separated from the sidewalls by another material layer. The PAS layer can be said to fill the contact hole 25 in both of these examples. FIG. 8 is a view for describing the arrangement of the second contact hole 250 according to the embodiment of the present disclosure.

The pixel P2 shown in FIG. 8 is positioned at the boundary between the display area DA and the non-display area NDA.

Each pixel P2 has a first length X in a first direction DR1 and a second length Y in a second direction DR2 perpendicular to the first direction DR1. The first length X is shorter than the second length Y. Considering an average distance between the second thin-film transistor and the first contact hole 150 within the display area DA, it is preferable that the second contact hole 250 can be arranged in the second area NDA within a distance shorter than the first length X with respect to the boundary between the display area DA and the non-display area NDA.

As described above, the display panel according to the embodiment includes two or more types of thin-film transistors on the same substrate. Also, the second thin-film transistor apparatus can have uniform characteristics, regardless of where pixels are arranged.

While the embodiments of the present disclosure have been described in more detail with reference to the accompanying drawings, the present disclosure is not necessarily limited to the embodiment and can be variously changed without departing from the spirit of the present disclosure. Therefore, the embodiments of the present disclosure are not intended for limiting the spirit of the present disclosure but intended for describing the spirit of the present disclosure, and the scope of the spirit of the present disclosure is not limited by the embodiment. Accordingly, the foregoing embodiments are merely examples and are not to be construed as limiting the present disclosure. The scope of the present disclosure should be construed by the claims, and all the technical spirits within the scope equivalent thereto should be construed as being included in the right scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel comprising:
a substrate including a first area and a second area positioned outside the first area;
a buffer layer disposed in the first area and the second area and disposed on the substrate;
a first thin-film transistor including a polycrystalline semiconductor layer disposed in the first area and disposed on the buffer layer, and a first gate electrode disposed on the polycrystalline semiconductor layer;
a second thin-film transistor including an oxide semiconductor layer disposed in the first area, a second gate electrode disposed on the oxide semiconductor layer, and a second gate insulating layer interposed between the oxide semiconductor layer and the second gate electrode;
a first intermediate insulating layer disposed in the first area and the second area and interposed between the first thin-film transistor and the second thin-film transistor;

a first contact hole passing through the first intermediate insulating layer on the polycrystalline semiconductor layer; and a second contact hole passing through the first intermediate insulating layer in the second area, wherein:

the second thin film transistor is disposed on the first intermediate insulating layer; and the second gate insulating layer is disposed in the first area and the second area.

2. The display panel of claim 1, wherein the first thin-film transistor further comprises a first gate insulating layer interposed between the polycrystalline semiconductor layer and the first gate electrode.

3. The display panel of claim 2, wherein the first contact hole and the second contact hole pass through the first gate insulating layer.

4. The display panel of claim 3, further comprising a passivation layer disposed in the first area and the second area and disposed on the second thin-film transistor, wherein the passivation layer is connected to the buffer layer through the second contact hole.

5. The display panel of claim 1, wherein the first contact hole and the second contact hole pass through the second gate insulating layer.

6. The display panel of claim 1, further comprising a passivation layer disposed in the first area and the second area and disposed on the second thin-film transistor, wherein the passivation layer fills the second contact hole.

7. The display panel of claim 1, wherein the polycrystalline semiconductor layer is further disposed in the second area.

8. The display panel of claim 7, further comprising a passivation layer disposed in the first area and the second area and disposed on the second thin-film transistor, wherein the passivation layer is connected, through the second contact hole, to the polycrystalline semiconductor layer disposed in the second area.

9. The display panel of claim 7, wherein the first thin-film transistor further comprises a first gate insulating layer interposed between the polycrystalline semiconductor layer and the first intermediate insulating layer.

10. The display panel of claim 9, wherein the first contact hole and the second contact hole pass through the first gate insulating layer.

11. The display panel of claim 1, wherein the first area is a display area where a plurality of pixels is arranged, and wherein the second area is a non-display area.

12. The display panel of claim 11, wherein the plurality of pixels comprises a plurality of edge pixels disposed at a boundary between the first area and the second area, and wherein the second contact hole is disposed adjacent to the plurality of edge pixels.

13. The display panel of claim 11, wherein each of the pixels has a first length in a first direction and a second length in a second direction perpendicular to the first direction, wherein the first length is shorter than the second length, and wherein the second contact hole is arranged in the second area within a distance shorter than the first length from a boundary between the first area and the second area.

14. A display apparatus comprising: the display panel according to claim 1; a driving circuit; and a cover glass covering the display panel.

15. A display panel comprising: a display area where a plurality of pixels is arranged; and a non-display area outside the display area, wherein;

each of the plurality of pixels includes:

a first thin-film transistor and a second thin-film transistor having different properties from the first thin-film transistor;

an intermediate insulating layer disposed in the display area and the non-display area and interposed between the first thin-film transistor and the second thin-film transistor, and a first contact hole passing through the intermediate insulating layer;

the second thin-film transistor in an edge pixel among the plurality of pixels positioned at a boundary between the display area and the non-display area is adjacent to the non-display area, and is disposed on the intermediate insulating layer;

a second contact hole is disposed in the non-display area adjacent to the second thin-film transistor in the edge pixel; and the second contact hole passes through the intermediate insulating layer.

16. The display panel of claim 15, wherein the first thin-film transistor comprises a polycrystalline semiconductor layer, a first gate electrode and a first gate insulating layer interposed between the polycrystalline semiconductor layer and the first gate electrode, and the second thin-film transistor comprises an oxide semiconductor layer.

17. The display panel of claim 16, wherein the intermediate insulating layer comprises a nitride layer disposed close to the polycrystalline semiconductor layer and an oxide layer disposed close to the oxide semiconductor layer.

* * * * *